(12) United States Patent
Kuehn

(10) Patent No.: US 7,206,628 B2
(45) Date of Patent: Apr. 17, 2007

(54) METHOD AND APPARATUS FOR IMPROVING THE VESSEL/TISSUE CONTRAST IN TIME-OF-FLIGHT ANGIOGRAPHY OF A MAGNETIC RESONANCE TOMOGRAPHY MEASUREMENT

(75) Inventor: Bernd Kuehn, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 482 days.

(21) Appl. No.: 10/407,676

(22) Filed: Apr. 4, 2003

(65) Prior Publication Data

US 2003/0220560 A1 Nov. 27, 2003

(30) Foreign Application Priority Data

Apr. 25, 2002 (DE) .............................. 102 18 515

(51) Int. Cl.
*A61B 5/05* (2006.01)
(52) U.S. Cl. .................. 600/410; 600/407; 600/419
(58) Field of Classification Search ................ 600/419, 600/407, 410
See application file for complete search history.

(56) References Cited

U.S. PATENT DOCUMENTS

| | | | |
|---|---|---|---|
| 5,202,632 A * | 4/1993 | Kaufman et al. ............ 324/309 |
| 5,522,390 A * | 6/1996 | Tuithof et al. .............. 600/410 |
| 6,201,986 B1 * | 3/2001 | Riederer et al. ............ 600/419 |
| 6,230,039 B1 * | 5/2001 | Stuber et al. ............... 600/410 |
| 6,307,368 B1 * | 10/2001 | Vasanawala et al. ........ 324/309 |
| 6,636,038 B1 | 10/2003 | Heid | |
| 6,957,097 B2 * | 10/2005 | Park et al. .................. 600/419 |

FOREIGN PATENT DOCUMENTS

EP 0 798 566 1/2002

* cited by examiner

*Primary Examiner*—Brian L. Casler
*Assistant Examiner*—James Kish
(74) *Attorney, Agent, or Firm*—Schiff Hardin LLP

(57) ABSTRACT

In a method and apparatus for improving the vessel/tissue contrast in time-of-flight angiography with a magnetic resonance tomography measurement, a sequence of radiofrequency excitation pulses is generated that each have a flip angle and a temporal spacing in the sequence defined by a repetition time, gradient pulses are generated with gradient coils such that, using an analog-to-digital converter, the magnetic resonance response signals are sampled in the frequency domain (k-space) in a slice referred to as a k-matrix, the k-matrix is sampled such that the respective distances of the measuring points from the center of the k-matrix are continuously increased (or decreased), and the repetition time is varied during the sampling, and/or the flip angle is varied during the sampling.

20 Claims, 5 Drawing Sheets

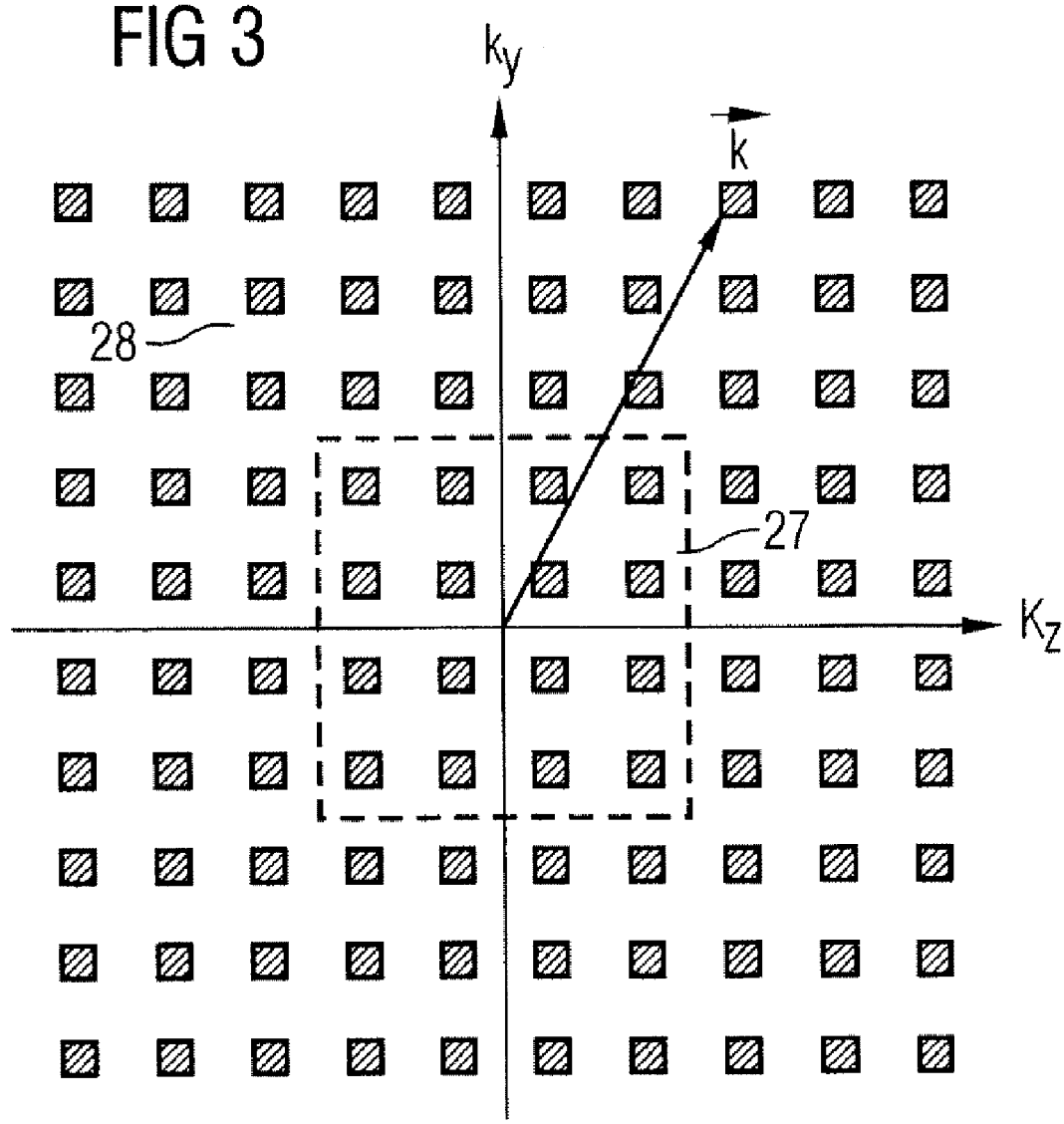

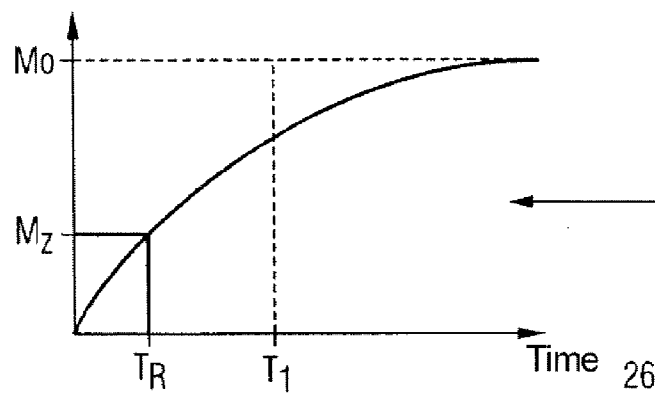
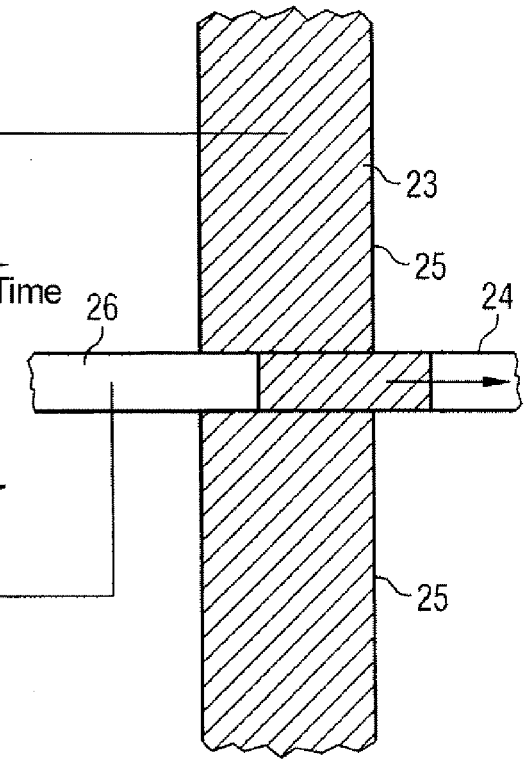
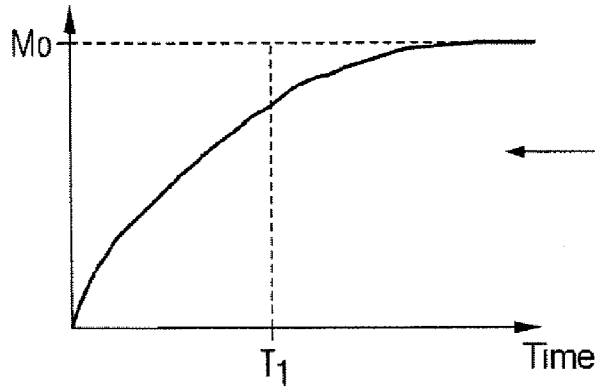
☐ Full or unrelaxed spins
▨ saturated spins

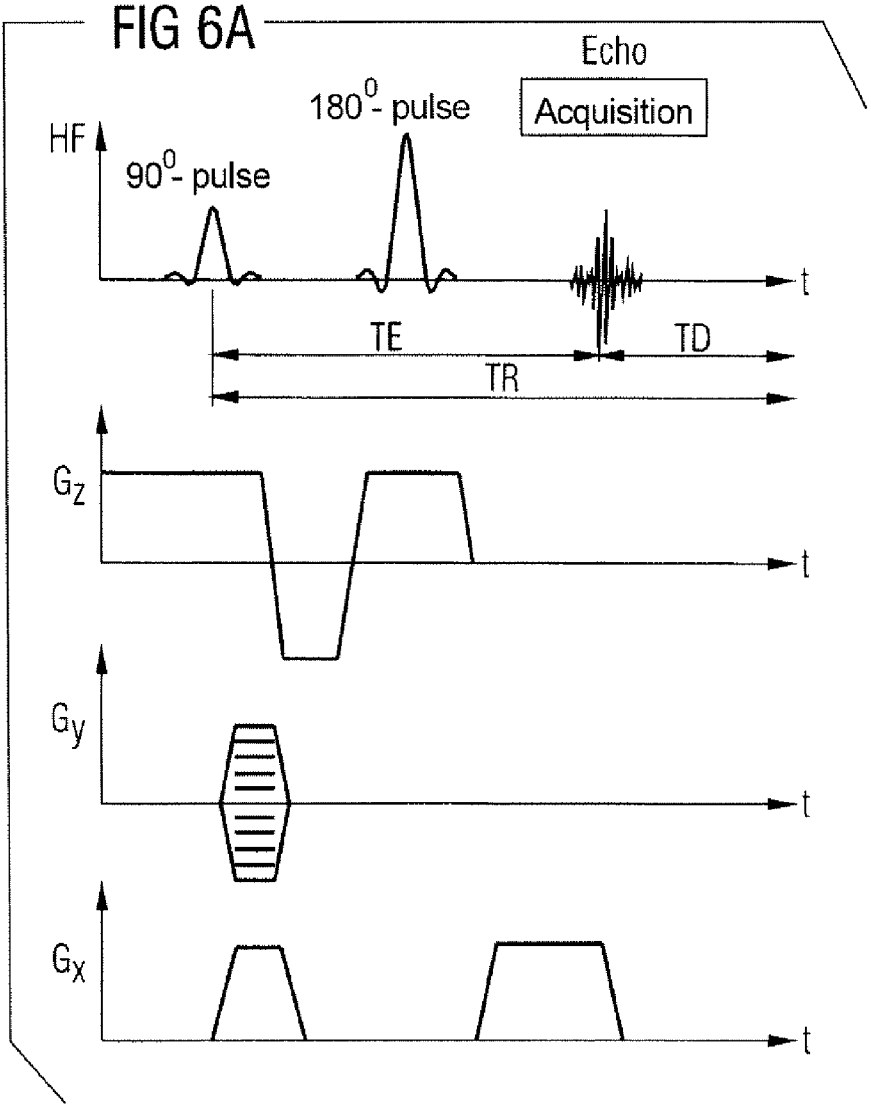
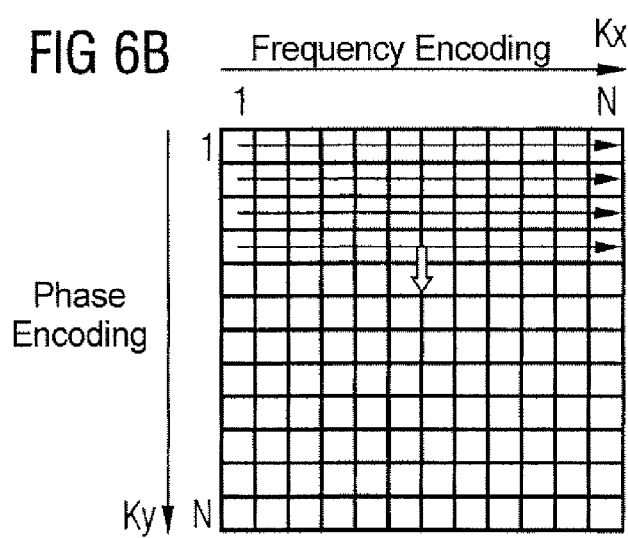

METHOD AND APPARATUS FOR IMPROVING THE VESSEL/TISSUE CONTRAST IN TIME-OF-FLIGHT ANGIOGRAPHY OF A MAGNETIC RESONANCE TOMOGRAPHY MEASUREMENT

BACKGROUND OF THE INVENTION

1. Field of the Invention

The present invention is directed in general to magnetic resonance tomography (MRT) as employed in medicine for examining patients. The present invention is particularly directed to a method for the optimization of k-space trajectories in the location encoding of a magnetic resonance tomography apparatus. An optimally fast sampling of k-matrix achieved as a result thereof leads to the utmost effectiveness of the sequence employed.

2. Description of the Prior Art

MRT is based on the physical phenomenon of nuclear magnetic resonance and has been successfully employed in medicine and biophysics for more than 15 years. In this examination modality, the subject is subjected to a strong, constant magnetic field. As a result thereof, the nuclear spins in the subject align, these having been previously irregularly oriented. Radiofrequency energy can then excite these "ordered" spins to a specific oscillation. This oscillation generates the actual measured signal in MRT that is picked up with suitable reception coils. By utilizing non-uniform magnetic fields, which are generated by gradient coils, the test subject can be spatially encoded in all three spatial directions, which is generally referred to as "location encoding".

The acquisition of the data in MRT ensues in k-space (frequency domain). The MRT image or spatial domain is obtained from the MRT data in k-space by means of Fourier transformation. The location encoding of the subject that k-space defines ensues by means of gradients in all three spatial directions. A distinction is made between the slice selection (defines an exposure slice in the subject, usually the Z-axis), the frequency encoding (defines a direction in the slice, usually the x-axis) and the phase encoding (defines the second dimension within the slice, usually the y-axis).

First, a slice is selectively excited, for example in the z-direction. The encoding of the location information in the slice ensues by means of a combined phase and frequency encoding with these two aforementioned, orthogonal gradient fields, which, for the example of a slice excited in z-direction, are generated by the gradient coils in the x-direction and the y-direction that have likewise already been mentioned.

FIGS. 6A and 6B show a first possible form of acquiring the data in an MRT scan. The sequence employed is a spin-echo sequence. With such a sequence, the magnetization of the spins is forced into the x-y-plane by means of a 90° excitation pulse. Over the course of time (½ $T_E$; $T_E$ is the echo time), a dephasing of the magnetization component that together form the cross-magnetization in the x-y-plane $M_{xy}$ occurs. After a certain time (for example, ½ $T_E$), a 180° pulse is emitted in the x-y-plane so that the dephased magnetization components are mirrored without the precession direction and the precession times of the individual magnetization components being varied. After a further time duration ½ $T_E$, the magnetization components again point in the same direction, i.e. a regeneration of the cross-magnetization that is referred to as "rephasing" occurs. The complete regeneration of the cross-magnetization is referred to as spin echo.

In order to measure an entire slice of the examination subject, the imaging sequence is repeated N-times for various values of the phase encoding gradient, for example $G_y$, with the frequency of the magnetic resonance signal (spin-echo signal) being sampled in every sequence repetition, and is digitalized and stored N-times in equidistant time steps $\Delta t$ in the presence of the readout gradient $G_x$ by means of the $\Delta t$-clocked ADC (analog-to-digital converter). According to FIG. 6B, a number matrix (matrix in k-space or k-matrix) with N×N data points is obtained in this way (a symmetrical matrix having N×N points is only an example; asymmetrical matrices also can be generated). An MR image of the observed slice having a resolution of N×N pixels can be directly reconstructed from this dataset by means of a Fourier transformation.

In a time-of-flight angiography with a magnetic resonance measurement, the imaging slice typically is oriented perpendicularly to the vessels to be presented. FIG. 4C schematically shows such an excitation slice 43. Contradictory demands are made on the repetition time TR in order to be able to produce an optimum contrast between the stationary tissue and the vessels 24.

The TR should be selected as short as possible in order to saturate the stationary tissue 23 as highly as possible. Given a flipping of the spins in immediate succession, there is not enough time for the magnetization to build up completely again in the longitudinal direction. This means that, given excitations in rapid succession, i.e. during a very short time TR, only s small magnetization vector $M_z$ in terms of magnitude is regenerated in the longitudinal direction according to FIG. 4a, this also generating only a small signal after the flipping by the RF pulse. As a result, the stationary tissue 23 is shown very dark in the image. This is referred to as a saturation of the spins.

The spins of the blood 26 that flows through the vessels 23 to be presented are excited only when the blood 26 flows into the excitation layer 23. Since the blood has not yet experienced an RF excitation before entering into the excitation layer 23, the full (relaxed) magnetization of the spins of the blood $M_0$ is available upon entry into the slice (see FIG. 4b). This results in the blood 26 flowing into the slice, and thus the blood-traversed vascular system, being shown brighter in the MRT image than the surrounding, stationary tissue 23. The ideal case would be an entry of the completely relaxed blood 26 into the slice 23 to be measured, a one-time excitation of the blood and, finally, an emergence of the once-stimulated blood from this slice before the next RF excitation ensues. This ideal case often cannot be achieved in reality since the slice thicknesses in the exposures of vascular anatomy are very large (approximately 4–6 cm), and the blood has a low flow velocity, especially in smaller vessels. Overall, the blood therefore experiences more than one excitation while flowing through the slice, leading to the blood at the "exit" end of the slice 25 exhibiting increasingly less contrast from the surrounding background tissue. In order to avoid this effect, the TR must be selected very high, i.e. sufficiently high so that the blood can flow through the entire slice block within the TR interval.

The spin saturation also can be influenced in the same way by the flip angle α. For example, a strong, fast saturation is achieved by means of a large flip angle. A small flip angle, however, leads to a fast relaxation of the flipped spins, so that the full longitudinal magnetization M0 is already available again after a very short time. Accordingly, the flip angle a should be large for a suppression of the stationary tissue but should be small for emphasizing the flowing blood.

In practice, the two demands—TR as short as possible for one reason but long for other reasons, and the flip angle a being very large for one reason but very small for other reasons—cannot be simultaneously satisfied, since they are contradictory. Conventionally, TR and/or a therefore are selected such that a compromise is found between the contradictory demands. The quality of the vessel presentation nonetheless continuously decreases with decreasing flow velocity of the blood.

SUMMARY OF THE INVENTION

It is an object of the present invention to improve the contrast of time-of-flight angiography.

This object is inventively achieved in a method and apparatus for improving the vessel/tissue contrast in time-of-flight angiography of a magnetic resonance tomography measurement wherein a sequence of radiofrequency excitation pulses is generated that each have a flip angle and a temporal spacing in the sequence defined by a repetition time, gradient pulses are generated with gradient coils and, using an analog-to-digital converter (ADC), the magnetic resonance response signals are sampled in the frequency domain (k-space) in a slice referred to as the k-matrix, the k-matrix is sampled such that the respective distance of the measuring points from the center of the k-matrix are continuously increased (or decreased), and the repetition time is varied during the sampling and/or the flip angle is varied during the sampling.

A functional relationship is produced between distance and repetition time, so that the repetition times varies during the sampling.

Further, a functional relationship is produced between distance and flip angle, so that the flip angle is varied during the sampling.

The variation of the repetition time inventively ensues such that the repetition time is increased given an increase of the distance and the repetition time is lowered given a reduction of the distance.

The variation of the flip angle inventively ensues such that the flip angle is decreased given an increase of the distance and the flip angle is increased given a reduction of the distance.

The functional relationship between distance and flip angle is linearly decreasing, indirectly proportional or exponential.

The functional relationship between distance and repetition time is linearly increasing, directly proportional or exponential.

DESCRIPTION OF THE DRAWINGS

FIG. 3 shows a k-matrix to be sampled in the $k_y$-$k_z$-plane with 10×10 measuring points as well as a vector $\vec{k}$ from the center of the k-matrix to a measuring point of the k-matrix.

FIGS. 4A, 4B, and 4C respectively show a section through an excitation slice perpendicular to a blood-traversed vessel as well as a schematic diagram of the respective saturation curve of the longitudinal magnetization both of the excitation slice as well as of blood flowing into the excitation slice.

FIG. 6A schematically shows the time curve of the gradient pulse current function of a spin-echo sequence.

FIG. 6B schematically shows the temporal sampling of the k-matrix given a spin-echo sequence according to FIG. 6a.

DESCRIPTION OF THE PREFERRED EMBODIMENTS

Figure 5:
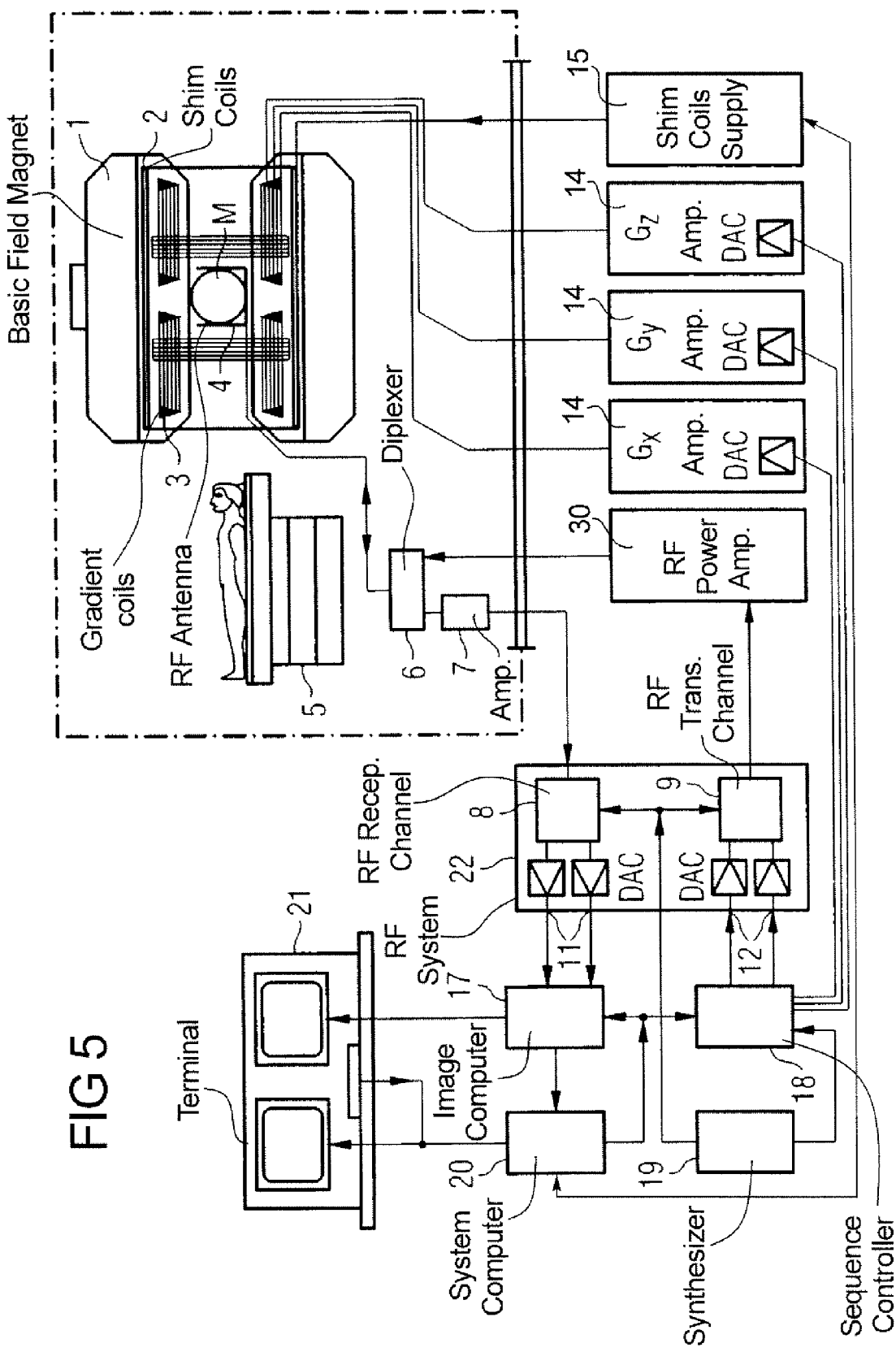
FIG. 5 schematically shows a magnetic resonance tomography apparatus for implementing the inventive method.

FIG. 5 is a schematic illustration of a nuclear magnetic resonance tomography apparatus with improved contrast behavior of MR time-of-flight angiography exposures according to the present invention. The basic components of the magnetic resonance tomography apparatus correspond to those of a conventional tomography apparatus, with the differences discussed below. A basic field magnet 1 generates a temporally constant, strong magnetic field for the polarization or alignment of the nuclear spins in the examination region of a subject such as, for example, a part of a human body to be examined. The high homogeneity of the basic magnetic field required for the magnetic resonance measurement is defined in a spherical measurement volume M into which the parts of the human body to be examined are introduced. For satisfying the homogeneity requirements and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with current by an amplifier 14 for generating a linear gradient field in one direction of the Cartesian coordinate system. The first sub-winding of the gradient field system generates a gradient $G_x$ in the x-direction, the second sub-winding generates a gradient $G_y$ in the y-direction and the third sub-winding generates a gradient $G_z$ in the x-direction. Each amplifier 14 has a digital-to-analog converter that is driven by a sequence controller 18 for the temporally correct generation of gradient pulses.

A radiofrequency antenna 4 is situated within the gradient field system 3. This antenna 4 converts the radiofrequency pulse output by a radiofrequency power amplifier 30 into a magnetic alternating field for exciting the nuclei and alignment of the nuclear spins of the examination subject or of the region of the subject to be examined. Usually a pulse sequence is employed having one or more radio frequency pulses and one or more gradient pulses. The radiofrequency antenna 4 also converts the alternating field emanating from the precessing nuclear spins, i.e. the nuclear spin echo signals, into a voltage that is supplied via an amplifier 7 to a radiofrequency reception channel 8 of a radiofrequency system 22. The radiofrequency system 22 also has a transmission channel 9 in which the radiofrequency pulses for exciting the nuclear magnetic resonance are generated. The respective radiofrequency pulses are digitally represented as a sequence of complex numbers in the sequence controller 18 on the basis of a pulse sequence prescribed by the system computer 20. As a real part and an imaginary part, this number sequence is supplied via an input 12 to a digital-toanalog converter in the radiofrequency system 22 and from the latter to a transmission channel 9. In the transmission channel 9, the pulse sequences are modulated onto a high-frequency carrier signal having a base frequency corresponding to the resonant frequency of the nuclear spins in the measurement volume.

The switching from transmission mode to reception mode ensues via a transmission-reception diplexer 6. The radiofrequency antenna 4 emits the radiofrequency pulses for exciting the nuclear spins into the measurement volume M and samples resulting echo signals. The correspondingly acquired magnetic resonance signals are phase-sensitively demodulated in the reception channel 8 of the radiofrequency system 22 and converted via a respective analog-to-digital converters into a real part and an imaginary part of the measured signal. An image computer 17 reconstructs an image from the measured data acquired in this way. The management of the measured data, of the image data and of the control programs ensues via the system computer 20. On the basis of control programs, the sequence controller 18 controls the generation of the desired pulse sequences and the corresponding sampling of k-space. In particular, the sequence controller 18 controls the temporally correct switching of the gradients, the emission of the radiofrequency pulses with defined phase and amplitude as well as the reception of the magnetic resonance signals. The time base (clock) for the radiofrequency system 22 and the sequence controller 18 is made available by a synthesizer 19. The selection of suitable control programs for generating a magnetic resonance image as well as the presentation of the generated magnetic resonance image ensue via a terminal 21 that has a keyboard as well as one or more picture screens.

The present invention utilizes the fact that different regions of the k-matrix have a different influence on the MRT image generated by Fourier transformation. Thus, the contrast of an MRT images is essentially determined by the measuring points in the central region (27 in FIG. 3) of the k-matrix. The measuring points in the outer region of the k-matrix (28 in FIG. 3) are the determining factor for the resolution of the MRT images.

Since the tissue background or the stationary tissue of an angiographic exposure represents essentially a large-area structure, the intensity thereof is mainly established by the central measuring points of the k-matrix (characterized by low spatial frequencies). By contrast, the vessels usually represent small image details whose intensity is determined by measuring points in the outer region of the k-matrix (higher spatial frequencies).

The fact that the outer region and the central region of the k-matrix are measured in respectively different ways is utilized in accordance with the invention by sampling those regions with the system computer 20 or the sequence controller 18 with respectively different measurement parameters. In order to improve tissue/vessel contrast in an MR time-of-flight angiography, the k-space points of the central region are acquired with a shorter repetition time TR than the k-space points of the outer region. An alternative or additional procedure is to employ a larger flip angle of the RF excitation pulse emitted with the radiofrequency antenna 4 for the central k-space points than for the k-space points of the outer region of the k-matrix.

Figure 2:
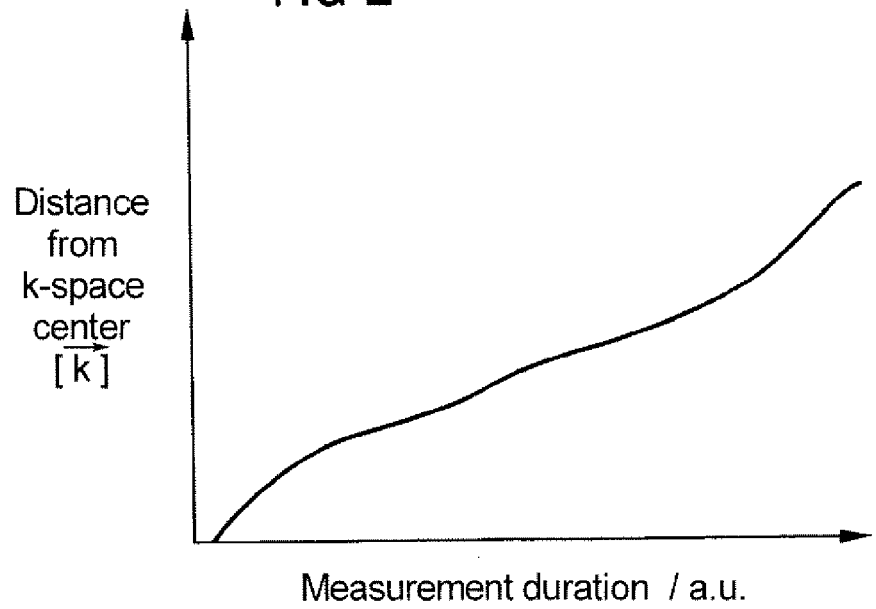
FIG. 2 is a diagram of the inventive functional dependency of the distance of a measuring point of the k-matrix from the center of the k-matrix on the measurement duration.

Inventively, the measurement ensues such that the k-matrix is sampled proceeding either from the center or from an outermost point of the k-matrix such that the distance $|\vec{k}|$ of the respective measuring point from the center of the k-matrix is continuously increased or reduced during the measurement. The diagram in FIG. 2 shows such a functional relationship of the distance $|\vec{k}|$ to the measurement duration for the case of a continuous increase. For example, this can be based on a circular or helical k-space trajectory (sampling path).

Figure 1:
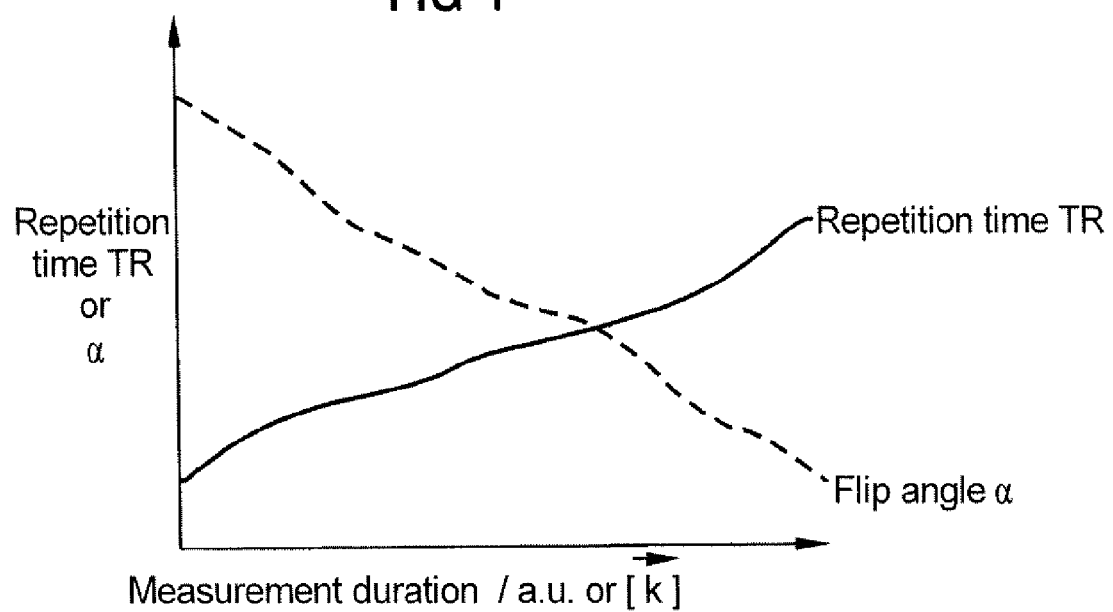
FIG. 1 is a diagram of the inventive functional dependency of the repetition time TR as well as of the flip angle a on the measurement duration or distance of a measuring point of the k-matrix from the center of the k-matrix.

When the repetition time TR is varied such that the sampling starts with a very short repetition time (the sampling thus begins in the center given the example of FIG. 2) and the TR is continuously increased with increasing distance of the measuring point from the center of the k-matrix (as shown in FIG. 1 by the non-perforated curve), a good suppression of the stationary tissue can be combined with an improved presentation of the vessels.

An analogous effect can be achieved when the measurement in the center of the k-matrix is begun with a large flip angle in order to achieve a strong saturation effect in the stationary tissue and then the flip angle is continuously reduced with increasing distance $|\vec{k}|$—according to the dashed curve in FIG. 1.

Inventively, thus, a functional relationship is produced between the repetition time and the distance $|\vec{k}|$, or between the flip angle, and the measurement duration/$|\vec{k}|$. The exact mathematical relationship between the distance $|\vec{k}|$ and the flip angle, or between the distance $|\vec{k}|$ and the repetition time is entered, for example, via the terminal (21).

The described techniques—TR variation and flip angle variation—can be implemented individually as well as in combination.

It should be noted that the inventively generated, functional relationship between the repetition time and the distance $|\vec{k}|$ and between the flip angle and the distance $|\vec{k}|$ can be of a different mathematical nature. For example, a linearly increasing or a directly proportional relationship (in the case of the repetition time) and a linearly decreasing or indirectly proportional relationship (in the case of the flip angle) would be meaningful. However, a logarithmic, exponential, etc., relationship between the distance $|\vec{k}|$ and the repetition time, or between the distance $|\vec{k}|$ and the flip angle, is likewise possible.

The inventive procedure thus makes it possible to saturate the stationary background tissue, so that blood flowing slowly into vessels to be highly resolved is saturated to a lesser extent than in conventional methods and systems. A clearly better tissue/vessel contrast ensues as a result. This advantage is particularly effective given small vessels with low flow velocities.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for improving vessel/tissue contrast in time-of-flight angiography with a magnetic resonance tomography measurement, comprising the steps of:

emitting a sequence of radio frequency excitation pulses into an examination volume of a subject containing vessels and tissue, said radio frequency excitation pulses each having a flip angle and having respective temporal spacings in said sequence defined by a repetition time;

emitting gradient pulses into said examination volume from gradient coils and obtaining magnetic resonance signals from said examination subject, as frequency domain signals, and entering said frequency domain signals into a k-matrix as measuring points, said k-matrix having a center;

sampling said k-matrix by one of continuously increasing or decreasing respective distances of the measuring points from the center of the k-matrix, thereby obtaining a plurality of samples;

generating a magnetic resonance image from said samples wherein said vessels and said tissue are shown with a vessel/tissue contrast; and during said sampling of said k-matrix, varying said repetition time to optimize said vessel/tissue contrast.

2. A method as claimed in claim 1 wherein the step of varying said repetition time comprises varying said repetition time by producing a functional relationship between said distance and said repetition time.

3. A method as claimed in claim 2 comprising selecting said functional relationship from the group consisting of a linearly increasing relationship, a directly proportional relationship, and an exponential relationship.

4. A method as claimed in claim 2 wherein the step of sampling said k-matrix comprises continuously increasing the respective distances, and wherein the step of varying said repetition time comprises increasing said repetition time as the respective distances increase.

5. A method as claimed in claim 2 wherein the step of sampling said k-matrix comprises continuously decreasing the respective distances, and wherein the step of varying said repetition time comprises decreasing said repetition time as the respective distances decrease.

6. A method as claimed in claim 1 comprising, in addition to varying said repetition time, varying said flip angle.

7. A method as claimed in claim 6 wherein the step of sampling said k-matrix comprises continuously increasing the respective distances, and wherein the step of varying said flip angle comprises decreasing said flip angle as the respective distances increase.

8. A method as claimed in claim 6 wherein the step of sampling said k-matrix comprises continuously decreasing the respective distances, and wherein the step of varying said flip angle comprises increasing said flip angle as the respective distances decrease.

9. The method as claimed in claim 1 wherein the step of varying said flip angle comprises varying said flip angle by producing a functional relationship between said distance and said flip angle.

10. A method as claimed in claim 9 comprising selecting said functional relationship from the group consisting of a linearly decreasing relationship, an indirectly proportional relationship, and an exponential relationship.

11. A magnetic resonance tomography apparatus for improving vessel/tissue contrast in time-of-flight angiography with a magnetic resonance tomography measurement, comprising:

a MR scanner having a radio frequency system for emitting a sequence of radio frequency excitation pulses into an examination volume of a subject containing vessels and tissue, said radio frequency excitation pulses each having a flip angle and having respective temporal spacings in said sequence defined by a repetition time;

a memory;

said scanner having a gradient system with gradient coils for emitting gradient pulses into said examination volume and for obtaining magnetic resonance signals from said examination subject, as frequency domain signals, and entering said frequency domain signals into a k-matrix in said memory as measuring points, said k-matrix having a center;

an image computer for sampling said k-matrix by one of continuously increasing or decreasing respective distances of the measuring points from the center of the k-matrix, thereby obtaining a plurality of samples and for generating a magnetic resonance image from said samples wherein said vessels and said tissue are shown with a vessel/tissue contrast; and a system control for controlling said MR scanner during said sampling of said k-matrix, by varying said repetition time to optimize said vessel/tissue contrast.

12. A magnetic resonance tomography apparatus as claimed in claim 11 wherein said system control varies said repetition time by producing a functional relationship between said distance and said repetition time.

13. A magnetic resonance tomography apparatus as claimed in claim 12 wherein said system control varies said repetition time using a functional relationship selected from the group consisting of a linearly increasing relationship, a directly proportional relationship, and an exponential relationship.

14. A magnetic resonance tomography apparatus as claimed in claim 12 wherein said image computer samples said k-matrix by continuously increasing the respective distances, and wherein said system control varies said repetition time by increasing said repetition time as the respective distances increase.

15. A magnetic resonance tomography apparatus as claimed in claim 12 wherein said image computer samples said k-matrix by continuously decreasing the respective distances, and wherein said system control varies said repetition time by decreasing said repetition time as the respective distances decrease.

16. A magnetic resonance tomography apparatus as claimed in claim 11 wherein said system control, in addition to varying said repetition time, varies said flip angle.

17. A magnetic resonance tomography apparatus as claimed in claim 16 wherein said image computer samples said k-matrix by continuously increasing the respective distances, and wherein said system control varies said flip angle by decreasing said flip angle as the respective distances increase.

18. A magnetic resonance tomography apparatus as claimed in claim 16 wherein said image computer samples said k-matrix by continuously decreasing the respective distances, and wherein said system control varies said flip angle by increasing said flip angle as the respective distances decrease.

19. A magnetic resonance tomography apparatus as claimed in claim 11 wherein said system control varies said flip angle by producing a functional relationship between said distance and said flip angle.

20. A magnetic resonance tomography apparatus as claimed in claim 19 wherein said system control varies said flip angle using a functional relationship selected from the group consisting of a linearly decreasing relationship, an indirectly proportional relationship, and an exponential relationship.

* * * * *